United States Patent [19]

Chumbres et al.

[11] 3,772,101

[45] Nov. 13, 1973

[54] LANDLESS PLATED-THROUGH HOLE PHOTORESIST MAKING PROCESS

[75] Inventors: Louis G. Chumbres, Poughkeepsie; George J. Rudy, Wappingers Falls, both of N.Y.

[73] Assignee: International Business Machines Corporation, Armonk, N.Y.

[22] Filed: May 1, 1972

[21] Appl. No.: 249,325

[52] U.S. Cl. .......................... 156/11, 96/36.2, 156/3, 156/16

[51] Int. Cl. .......................... C23f 1/02

[58] Field of Search .......................... 96/36.2; 117/212; 156/3, 11, 16; 29/625, 628; 174/68.5

[56] References Cited

UNITED STATES PATENTS

| | | | |
|---|---|---|---|
| 3,306,830 | 2/1967 | Bittrich et al. | 96/36.2 X |
| 3,483,615 | 12/1969 | Gottfried | 156/11 X |
| 3,672,986 | 6/1972 | Schneble et al. | 117/212 |
| 3,702,284 | 11/1972 | Merkenschlager | 117/212 X |

*Primary Examiner*—William A. Powell
*Attorney*—Robert J. Haase et al.

[57] ABSTRACT

A method for producing landless plated through holes in a printed circuit board. Holes are drilled through a copper clad insulating board and all exposed surfaces are sensitized and plated. A tenting photoresist material is placed over at least one of the major surfaces of the drilled board. In a first species, negative or positive photoresist is placed on both sides of the board. In a second species, positive photoresist is placed on one surface of the board at a time. A desired circuit pattern is produced in the tented photoresist, the circuit pattern including hole configurations having diameters no greater than the drilled holes. Tin-lead solder is placed through the circuit and the hole locations in the photoresist, the photoresist is removed and the unwanted copper cladding is etched away using the solder as an etching resist. In the first species, the holes in the photoresist are made smaller than the drilled holes using a separate photomask. In the second species, the holes in the positive photoresist are made precisely equal in size to the drilled holes using the board itself as a photomask.

8 Claims, 6 Drawing Figures

LANDLESS PLATED-THROUGH HOLE PHOTORESIST MAKING PROCESS

BACKGROUND OF THE INVENTION

1. Field of the Invention

The present invention generally relates to processes for making printed circuit boards having plated-through holes for interconnecting circuit points formed on opposite surfaces of the board. More specifically, the invention relates to a photoresist masking process for making landless plated through holes for such applications.

2. Description of the Prior Art

The desirability of landless plated through holes for conserving surface area on printed circuit substrates is well known. The high circuit density achievable by this technique, however, generally has been offset by difficulty in producing sound electrical connections because of photomask alignment or other process limitations. The IBM Technical Disclosure Bulletin, Volume 9, No. 10, March 1967, page 1,310, entitled "Landless Hole Circuit Card" by J. S. Crimi et al. teaches a method whereby drilled holes in a copper clad board are electroless plated using a liquid photoresist layer which is applied to the cladded surfaces through a patternless silk screen. The electroless plated through hole surfaces are covered by a tin-lead layer and the resist is removed. A new liquid photoresist layer is applied to the cladded surfaces and is selectively exposed to provide a desired conductive pattern reaching to the landless plated through holes. Undesired portions of the cladding are removed using the exposed photoresist. Thus, the landless plated through hole printed circuit board is produced at the expense of two liquid photoresist application steps which tend to allow the photoresist to run into the drilled holes causing relatively poor resist definition at the hole edges. Poor definition compromises the soundness of the electrical interconnections between the surface printed circuits and the conductive hole linings, especially in high circuit density applications.

The problems attributable to the use of liquid photoresists are avoided in the IBM Technical Disclosure Bulletin, Vol. 13, No. 1, June 1970, page 181, entitled "Landless Plated Through Hole Process" by R. H. Mead. In this case a film-type resist is laminated under pressure to a previously drilled copper clad board. The edges of the drilled holes tend to cut through the resist during the resist lamination step. The resist is flood-exposed and developed to obtain proper adherence to the board. A pressurized spray of developer and a pressurized spray of water are directed in succession at the exposed resist thereby completing the removal of the partially cut film-type resist at the locations of the drilled holes. Although the tendencies of liquid resist to run into the holes and to bead at the hole edges are avoided, the definition of the film-type resist at the hole edges suffers from the purely mechnical means by which the resist is cut and then removed where it covers the holes. For example, special care must be taken to insure that the edges of the drilled holes are sharply defined. Rounded corners at the edges of the drilled holes reduce the precision with which the film resist can be terminated at the hole edges, as is required for sound electrical interconnection between the surface printed circuits and the conductively lined hole surfaces.

SUMMARY OF THE INVENTION

A film-type resist is employed to make landless plated through hole printed circuit boards with the advantages attributable to simultaneous hole and circuit definition by photoprocessing while minimizing photomask alignment problems. The method comprises providing a copper clad mounting board, drilling holes through the board where required and sensitizing and plating the drilled hole surfaces. A film type (tenting) resist is placed over the drilled board. A desired circuit pattern is produced in the tented resist, the circuit pattern including hole configurations having diameters no greater thn the drilled holes. In a first species, the hole and circuit configurations are simultaneously exposed from the same side of tented negative or positive resist through a registered mask having holes smaller in diameter than the drilled holes. In a second species, the hole and circuit configurations are simultaneously exposed from opposite sides of positive tented resist. More particularly, the hole configurations are exposed using light which is directed through the holes from the side of the board opposite the side on which the tented positive resist is placed. In both species, an etching resist material is placed on the board surfaces which are not covered by the exposed and developed photoresist. The photoresist then is removed and the unwanted cladding is etched away where it is not protected by the etching resist material.

DESCRIPTION OF THE PREFERRED EMBODIMENTS

Figure 1A:
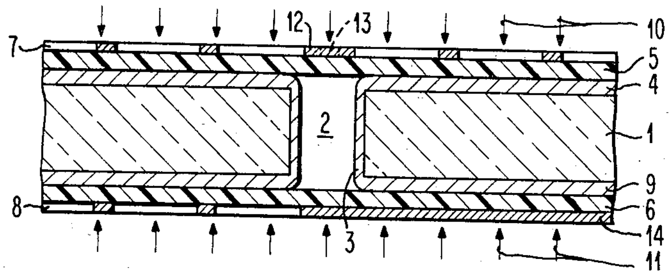
FIGS. 1A, 1B and 1C are cross sectional views of a printed circuit board at successive times during the method in accordance with a first species of the invention.

Referring to FIG. 1A, copper clad mounting board 1 is drilled at locations where plated-through hole connectors are desired between printed circuits to be established on the opposite major surfaces of the board. Hole 2 is shown by way of example. After drilling, all exposed surfaces of board 1 are sensitized and plated preferably by an electroless process such as electroless nickel which is well known in the art. The electroless plating produces a thin conductive lining 3 on the interior surfaces of hole 2 as well as on the original conductive cladding 4 and 9 of board 1. The lining 3 may be augmented, if desired, by an electroplated layer of copper, for example. In accordance with a first species of the present invention, film type (tenting) negative or positive photoresist layers 5 and 6 are fixed to the opposite major surfaces of clad board 1. Suitable photoresist is commercially available under the trademark "Riston" from E. I. DuPont deNemours and Company, Inc. The photomasks 7 and 8 placed on photoresist layers 5 and 6, respectively, define desired circuit patterns to be produced in the resist layers assuming, for example that negative resist is used.

The mask hole and circuit configurations are transferred to the negative photoresist layers 5 and 6 by simultaneously exposing the composite structure to light as represented by arrows 10 and 11. It is to be noted that the size of the hole in masks 7 and 8 is smaller than that of the drilled hole 2. For example, the opaque mask element 12 which produces the hole pattern in photoresist layer 5 is smaller in diameter than hole 2. Reaching out from the hole pattern in a direction pointing into the plane of the drawing is a surface conductor pattern represented by dashed mask element 13. A similar circuit conductor pattern is shown in mask 8 except that mask element 14 extends to the right from the location of hole 2 as viewed in the drawing. Thus, in the exemplary case of the disclosed embodiment, an upper surface conductor (to be formed using mask element 13) is to be electrically connected to a lower surface conductor (to be formed using mask element 14) via conductively lined plated through hole 2.

After exposure to light rays 10 and 11, the tented photoresist is developed to remove the unexposed photoresist at the locations of the desired surface circuit patterns as well as at the hole locations. An etching resist material, for example, a tin-lead solder is placed on the exposed board surfaces as shown in cross section in FIG. 1B at upper surface locations 15 and at lower board surface locations 16. In addition, the etching resist material is placed on the surfaces 17 of the conductively lined hole 2. Access to the hole surfaces is gained through the hole openings in the developed tented photoresist. The openings in the tented photoresist, being smaller in diameter than the drilled hole 2, provide overhanging shoulders which terminate the solder at the points where the plated layer 3 meets the overhanging upper photoresist 5 and the overhanging lower photoresist 6. The same result follows irrespective of small amounts of mask misalignment relative to the drilled hole. All that is required is that the maximum misalignment be less than the amount which would prevent a shoulder or overhang of photoresist from forming at any point about the perimeter of the plated drilled hole. The solder preferably is placed on the board surfaces exposed through the hole openings by electroplating.

Figure 1B:
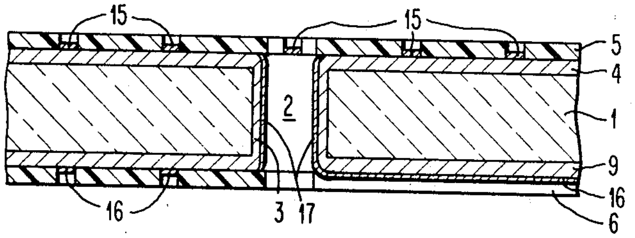
Figure 1C:
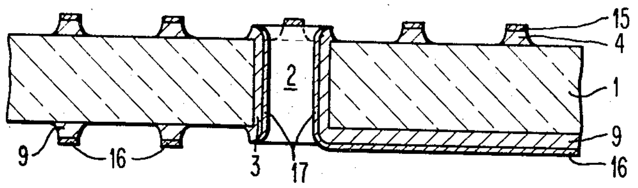

With the etching resist (solder) material in place, the photoresist layers 5 and 6 are removed and the unwanted cladding is etched away where it is not protected by the solder to yield the structure shown in FIG. 1C. It will be recognized, of course, that positive photoresist may be employed instead of the negative photoresist layers 5 and 6 simply by reversing the transparent and opaque areas of the masks 7 and 8. A suitable positive tenting photoresist is available under the trademark "Riston III" from E. I. DuPont deNemours and Company, Inc.

The process described with reference to FIGS. 1A, 1B and 1C is characterized by the formation of an overhang of photoresist sheet over the drilled hole except at that portion of the hole circumference where a surface conductor is to make contact with the conductive lining of the hole. The requirement for the resist overhang, however, increases the mask alignment problem for very small diameter drilled holes.

The present invention is readily adapted to the production of landless plated through holes without the requirement that an overhang be produced in the photoresist sheet thereby further reducing the mask registration problem of the species discussed in connection with FIGS. 1A, 1B and 1C. This advantage is achieved without objectionable increase in processing complexity simply by using the drilled board itself as a photomask as will be seen with reference to FIGS. 2A, 2B and 2C. This modified technique requires the use of positive tenting photoresist. Negative tenting photoresist is not suitable.

Figure 2A:
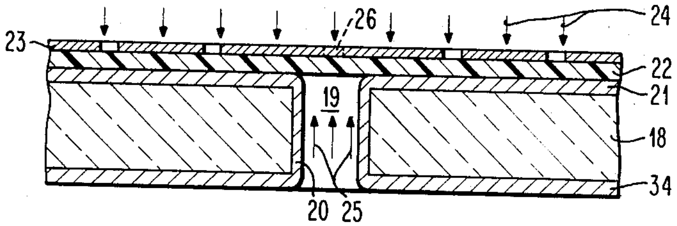
FIGS. 2A, 2B and 2C are cross sectional views of a printed circuit board at successive times during the method in accordance with a second species of the invention.

Referring to FIG. 2A, conductively clad board 18 is drilled at locations where plated-through hole connectors are desired as before. After drilling, all exposed surfaces of board 18 including the surfaces of hole 19 are sensitized and electroless plated to produce a thin conductive coating 20 on the interior surfaces of hole 19 as well as on the original surface cladding 21 and 34 of board 18. The coating 20, may be augmented, if desired, by an electroplated layer of copper, for example. Positive tenting photoresist 22 is fixed to one major surface only of clad board 18 and then covered with mask 23. Photoresist 22 is exposed on both sides simultaneously by light represented by arrows 24 passing through mask 23 and by light represented by arrows 25 from a separate light source passing through hole 19 in board 18. The underside of resist layer 22 is exposed over an area precisely corresponding to hole 19 thus eliminating entirely the need for a hole pattern in mask 23 and avoiding the correlative mask alignment problem. The only remaining mask alignment requirement is that pattern segment 26 reaches hole 19, a significantly milder alignment problem than the one discussed in connection with FIGS. 1A, 1B and 1C.

Figure 2B:
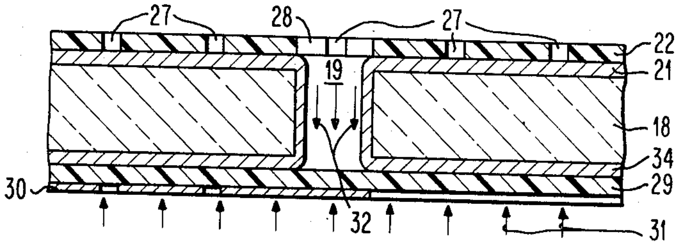
Figure 2C:
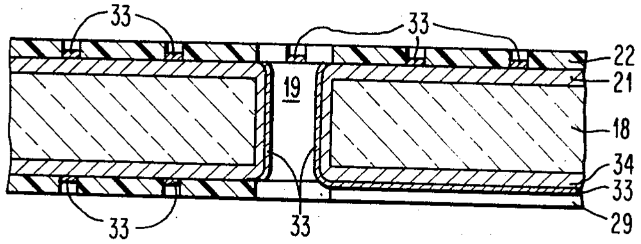

The exposed photoresist layer 22 is developed to provide circuit pattern apertures 27 of FIG. 2B and hole configuration aperture 28. Then, a second positive tenting photoresist layer 29 is fixed to the lower surface of clad board 18 and covered by a respective mask 30. Photoresist layer 29 is exposed simultaneously on opposite sides by light represented by arrows 31 passing through mask 30 and by light represented by arrows 32 from a separate light source passing through hole 19 in board 18. The exposed photoresist layer 29 is developed to provide circuit and hole pattern apertures therein. An etching resist material such as solder 33 is placed on all exposed surfaces of clad board 18 including the interior surfaces of hole 19 as shown in FIG. 2C. Photoresist layers 22 and 29 are removed and the unwanted cladding is etched away where it is not protected by the solder to yield the same structure shown in FIG. 1C.

While this invention has been particularly described with reference to the preferred embodiments thereof, it will be understood by those skilled in the art that the foregoing and other changes in form and details may be made therein without departing from the spirit and scope of the invention.

What is claimed is:

1. A method for producing landless plated through holes in a printed circuit board comprising:

providing a conductively clad insulating board,
placing holes through said board,
conductively plating the surfaces of the holes,
placing a tenting photoresist on at least one of the major surfaces of said board,
producing a desired circuit pattern in said photoresist by selective removal of said photoresist by exposure through a mask representing said pattern, said photoresist circuit pattern including hole configurations having boundaries not extending outside the perimeters of respective holes,
placing an etching resist material on said board through said photoresist circuit pattern, removing said photoresist material, and etching the cladding of said board where not covered by said etching resist material.

2. The method defined in claim 1 wherein said hole configurations are smaller in size than the size of respective holes.

3. The method defined in claim 2 wherein said photoresist is a positive photoresist.

4. The method defined in claim 2 wherein said photoresist is a negative photoresist.

5. The method defined in claim 1 wherein said photoresist is placed on both of said major surfaces of said board, and desired circuit patterns are produced simultaneously in said photoresist placed on both of said major surfaces of said board.

6. The method defined in claim 5 wherein said hole configurations are smaller in size than the size of respective holes.

7. The method defined in claim 1 wherein said hole configurations are produced in said photoresist by a process comprising exposing said photoresist to radiation directed through respective holes from the major surface of said board opposite the major surface on which said photoresist is placed.

8. The method defined in claim 7 wherein said photoresist is a positive photoresist.

* * * * *